(12) United States Patent
Cheng et al.

(10) Patent No.: US 9,508,640 B2
(45) Date of Patent: Nov. 29, 2016

(54) MULTIPLE VIA STRUCTURE AND METHOD

(71) Applicant: GLOBALFOUNDRIES INC., Grand Cayman (KY)

(72) Inventors: Cheng-Wei Cheng, White Plains, NY (US); Szu-Lin Cheng, Yorktown Heights, NY (US); Keith E. Fogel, Hopewell Junction, NY (US); Edward W. Kiewra, South Burlington, VT (US); Amlan Majumdar, White Plains, NY (US); Devendra K. Sadana, Pleasantville, NY (US); Kuen-Ting Shiu, White Plains, NY (US); Yanning Sun, Scarsdale, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 406 days.

(21) Appl. No.: 13/940,874

(22) Filed: Jul. 12, 2013

(65) Prior Publication Data

US 2015/0014778 A1    Jan. 15, 2015

(51) Int. Cl.
*H01L 21/00* (2006.01)
*H01L 23/522* (2006.01)
*H01L 23/485* (2006.01)
*H01L 21/8238* (2006.01)
*H01L 27/12* (2006.01)

(52) U.S. Cl.
CPC ... *H01L 23/5226* (2013.01); *H01L 21/823807* (2013.01); *H01L 21/823878* (2013.01); *H01L 23/485* (2013.01); *H01L 27/1207* (2013.01); *H01L 2924/0002* (2013.01)

(58) Field of Classification Search
CPC .................. H01L 21/8221; H01L 27/0688

USPC ......................................................... 257/369
See application file for complete search history.

(56) References Cited

U.S. PATENT DOCUMENTS

| | | | |
|---|---|---|---|
| 6,563,143 B2 | 5/2003 | Gao et al. | |
| 7,741,644 B2 * | 6/2010 | Lyu | H01L 21/8221 257/67 |
| 7,803,640 B2 * | 9/2010 | Izumi | H01L 27/11502 257/295 |
| 2009/0078963 A1 | 3/2009 | Khodja | |
| 2012/0305992 A1 | 12/2012 | Marino et al. | |
| 2013/0062665 A1 | 3/2013 | Kunert | |
| 2013/0062696 A1 | 3/2013 | Di et al. | |

FOREIGN PATENT DOCUMENTS

| | | |
|---|---|---|
| CN | 102487046 A | 6/2012 |
| CN | 102544009 A | 7/2012 |
| WO | WO2012155831 A1 | 11/2012 |

\* cited by examiner

*Primary Examiner* — Marcos D Pizarro
*Assistant Examiner* — Tifney Skyles
(74) *Attorney, Agent, or Firm* — Hoffman Warnick LLC; Michael Le Strange (57) ABSTRACT

A method for forming a device with a multi-tiered contact structure includes forming first contacts in via holes down to a first level, forming a dielectric capping layer over exposed portions of the first contacts and forming a dielectric layer over the capping layer. Via holes are opened in the dielectric layer down to the capping layer. Holes are opened in the capping layer through the via holes to expose the first contacts. Contact connectors and second contacts are formed in the via holes such that the first and second contacts are connected through the capping layer by the contact connectors to form multi-tiered contacts.

17 Claims, 10 Drawing Sheets

MULTIPLE VIA STRUCTURE AND METHOD

BACKGROUND

Technical Field

The present invention relates to semiconductor devices and processing, and more particularly to a multi-tiered via structure and methods for forming the same.

Description of the Related Art

With the use of multiple substrate materials for semiconducting processing, devices may be disposed at different heights across a chip. In one example, complementary metal oxide semiconductor (CMOS) devices may have NMOS devices and PMOS devices formed with different substrate materials for the bodies of the devices. In one application, a step height exists between a III-V material employed for NMOS devices (higher devices) and a silicon material employed for PMOS devices (lower devices). In some instances the step may be significant, e.g., 40 nm in a 22 nm technology.

The step height can result in difficulty forming contact via holes. Contact via holes typically include a cone or wedge shape, being thicker at the top and thinner at the bottom. To provide proper contacts for an interface to lower devices, the wedge size of the contact via becomes too large at the top to fit between higher devices.

SUMMARY

A method for forming a device with a multi-tiered contact structure includes forming first contacts in via holes down to a first level, forming a dielectric capping layer over exposed portions of the first contacts and forming a dielectric layer over the capping layer. Via holes are opened in the dielectric layer down to the capping layer. Holes are opened in the capping layer through the via holes to expose the first contacts. Contact connectors and second contacts are formed in the via holes such that the first and second contacts are connected through the capping layer by the contact connectors to form multi-tiered contacts.

Another method for forming a device with a multi-tiered contact structure includes forming first devices on a first semiconductor substrate at a first level; forming second devices at a second level, which is vertically offset from the first level, on a second semiconductor substrate formed over the first semiconductor substrate; depositing a first dielectric layer over the first devices; forming first contacts in via holes through the first dielectric layer down to the first level; forming a dielectric capping layer over exposed portions of the first contacts; forming a second dielectric layer over the capping layer; opening via holes in the second dielectric layer down to the capping layer; opening holes in the capping layer through the via holes to expose the first contacts; and forming contact connectors and second contacts in the via holes such that the first and second contacts are connected through the capping layer by the contact connectors to form multi-tiered contacts.

A device with a multi-tiered contact structure includes first contacts formed in via holes down to a first level, a dielectric capping layer formed over exposed portions of the first contacts and a dielectric layer formed over the capping layer. Second contacts are formed in the via holes such that the first and second contacts are connected through the capping layer by contact connectors to form multi-tiered contacts.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, multiple tiered via structures are provided. The via structures permit multiple wedges or cones to be employed in series to reduce the size accumulation needed for greater depths. In one embodiment, a double via structure is employed for lower lying devices (e.g., PMOS transistors) in CMOS devices. The double via structure includes first contact holes configured to form contacts having a landing portion. A dielectric layer is formed over the landing portion and opened to access the landing portion. Second vias are formed through the dielectric layer to provide second contacts to the landing portions. The multi-tiered contact structure can be assembled in a single conventional layer, i.e., a single conventional contact layer can now include a multi-tiered contact structure to preserve area.

In this way, the height difference between, e.g., III-V NMOS (by Aspect-Ratio-Trapping) and Si PMOS is no longer a factor in forming vias to devices formed on lower areas of the device. Since cone shaped via holes are formed on multiple tiers, there is enough room for these via holes to reach the PMOS devices on CMOS technology nodes of 22 nm or beyond.

It is to be understood that the present invention will be described in terms of a given illustrative architecture on a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
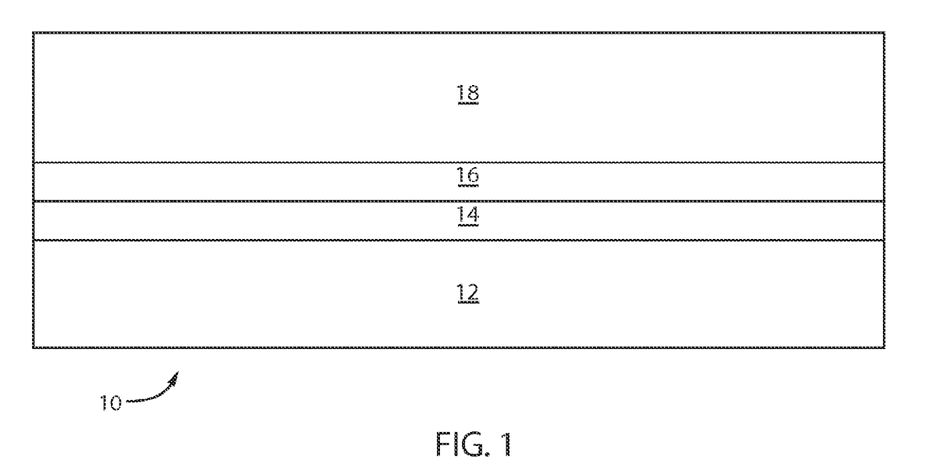
FIG. 1 is a cross-sectional view of a semiconductor on insulator substrate having a dielectric layer formed thereon in accordance with the present principles.

Referring now to the drawings in which like numerals represent the same or similar elements and initially to FIG. 1, a semiconductor-on-insulator (SOI) substrate 10 is shown having a dielectric layer 18 formed thereon. The SOI substrate 12 includes a base substrate layer 12, an insulator layer 14 and a semiconductor layer 16. The base substrate layer 12 may include a monocrystalline semiconductor material, such as, e.g., Si, SiGe, Ge, SiC, etc. The insulator layer 14 may include an oxide, e.g., a buried oxide (BOX), such as silicon oxide, a nitride, e.g., a silicon nitride, an oxynitride, e.g., a silicon oxynitride, etc. The semiconductor layer 16 may include a monocrystalline material such as, e.g., Si, SiGe, Ge, SiC, etc. The semiconductor layer 16 preferably includes Si and will be employed for P-channel metal oxide semiconductor (PMOS) devices as will be described below.

Figure 2:
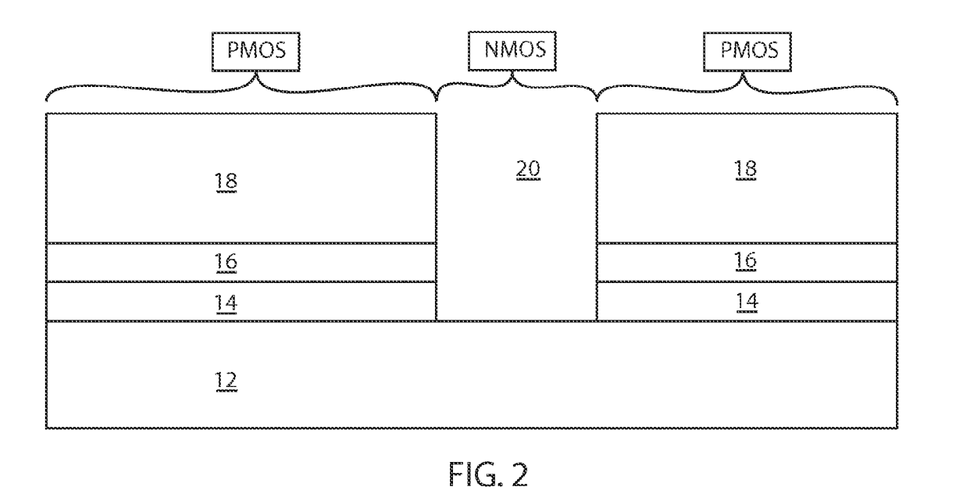
FIG. 2 is a cross-sectional view of a device of FIG. 1 showing a trench exposing the semiconductor substrate for forming an NMOS device in accordance with the present principles.

Referring to FIG. 2, PMOS and N-channel metal oxide semiconductor (NMOS) regions are defined. The NMOS region is defined by forming a mask (not shown) and etching the dielectric layer 18 and the semiconductor layer 16 down to the insulator 14 to form a trench 20.

Figure 3:
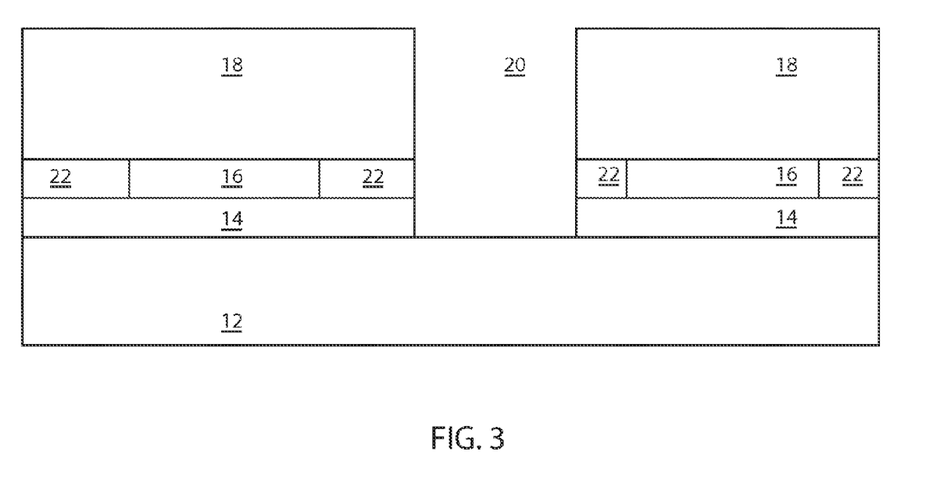
FIG. 3 is a cross-sectional view of the device of FIG. 2 showing portions of a semiconductor layer oxidized through the trench in accordance with the present principles.

Referring to FIG. 3, field oxide isolation is performed. This includes a lateral oxidation of the semiconductor layer 16 by subjecting regions of the semiconductor layer to an oxidizing agent by exposure through the trenches 20 to form field oxide regions 22. Field oxide regions 22 may be formed by providing an oxygen-containing gas or plasma at an elevated temperature (e.g., 200-400 degrees C.) to diffuse oxygen into the regions 22. The field oxide regions 22 provide electrical isolation between the NMOS and PMOS devices.

Figure 4:
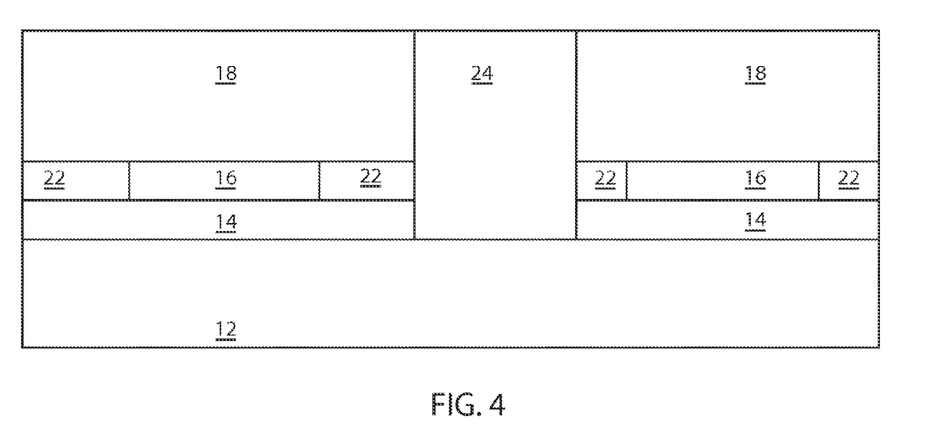
FIG. 4 is a cross-sectional view of the device of FIG. 3 showing a dummy plug formed in the trench in accordance with the present principles.

Referring to FIG. 4, a portion of the dielectric layer 14 is etched away to expose the base substrate 12. The etching process may include a reactive ion etch, although other etching processes may be employed. The trench 20 is then filled with a dielectric material and a top surface is planarized to form a dummy plug 24 at the location for NMOS devices. The dummy plug 24 may include a deposited silicon nitride material, although other suitable dielectric materials may be employed. The deposition process may include a chemical vapor deposition, although other processes may be employed. The planarization of the top surface may include a chemical mechanical polishing (CMP) process.

Figure 5:
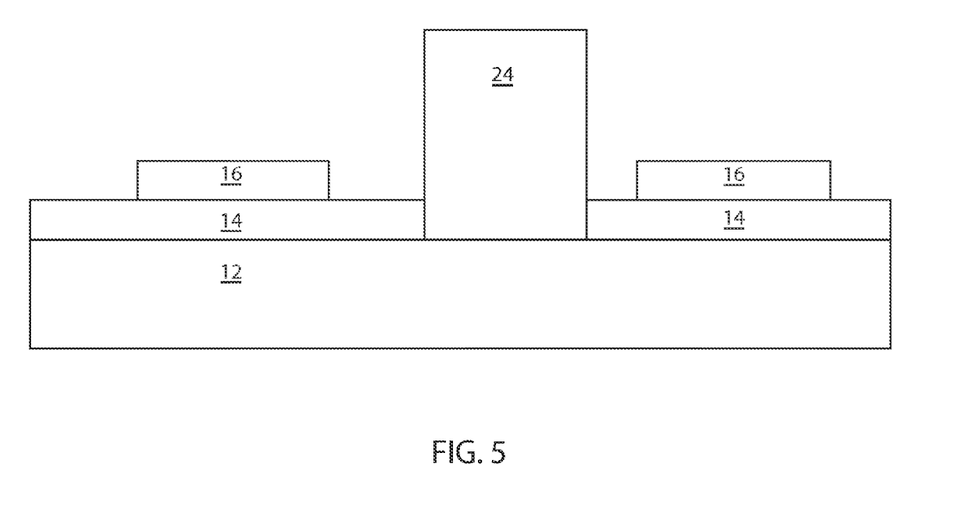
FIG. 5 is a cross-sectional view of the device of FIG. 4 showing the dummy plug and semiconductor portions exposed in accordance with the present principles.

Referring to FIG. 5, the dielectric layer 18 and the field oxide 22 are selectively etched away with respect to the dummy plug 24 and the semiconductor layer 16. The semiconductor layer 16 is now exposed for further processing to form PMOS devices, e.g., in silicon of the semiconductor layer 16. Known selective etch chemistries may be employed to remove, e.g., oxide from nitride (or vice versa) depending on the material selection for the dielectric layer 18, the field oxide 22, the dummy plug 24 and the semiconductor layer 16.

Figure 6:
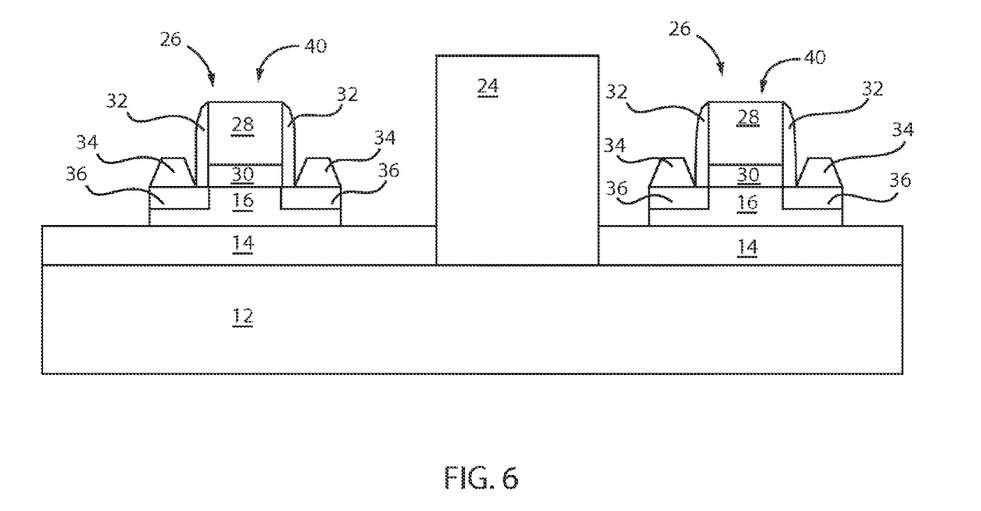
FIG. 6 is a cross-sectional view of the device of FIG. 5 showing PMOS devices formed on a first level in accordance with the present principles.

Referring to FIG. 6, PMOS devices 40 are formed. A gate stack 26 is formed on the semiconductor layer 16 by depositing and patterning a gate dielectric layer 30, which may include a high dielectric constant material (hi-K), such as, e.g., hafnium dioxide, etc. A gate conductor 28 is formed and patterned on the gate dielectric 30. The gate conductor and the gate dielectric 28 may be patterned in a single mask etching process. The gate conductor 28 may include a metal, such as W, Ti, Cu, etc., or metal-containing compounds, e.g., TiN, TaN, etc.

Sidewall spacers 32 are formed by depositing a dielectric material, e.g., silicon nitride, over the gate conductor 28 and the gate dielectric 30 and etching. The PMOS devices include a p-type (P+) source and drain regions (S/D regions) 36 and raised S/D regions 34. The S/D regions 36 may be doped using an ion implantation process, a diffusion process, etc. to dope portions of the semiconductor layer 16. Raised S/D regions 34 may be formed by epitaxial growth. The raised S/D regions 34 may be doped in-situ.

Figure 7:
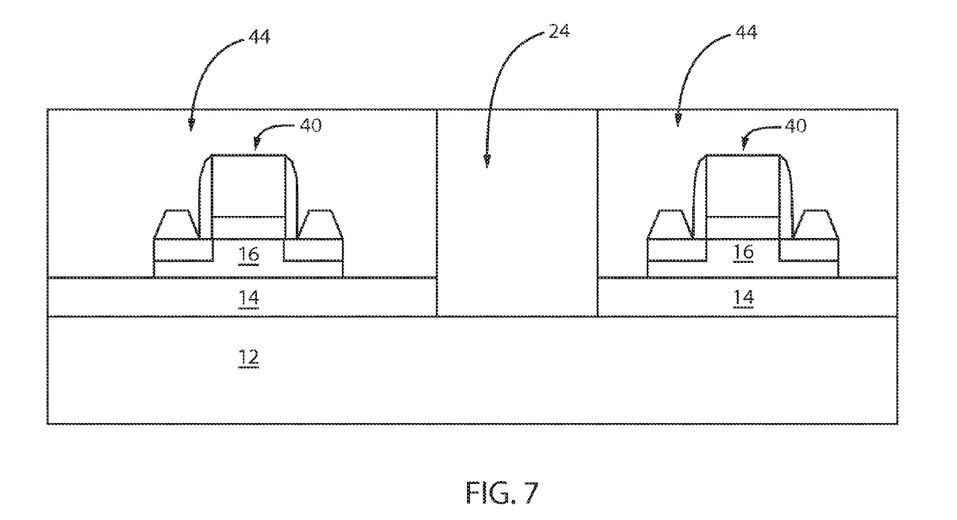
FIG. 7 is a cross-sectional view of the device of FIG. 6 showing PMOS devices buried in a dielectric layer in accordance with the present principles.

Referring to FIG. 7, the PMOS devices 40 are buried in a dielectric material 44, such as $SiO_2$ or similar material, by deposition followed by a CMP process to planarize the top surface. The deposition of material 44 may include a CVD or equivalent process.

Figure 8A:
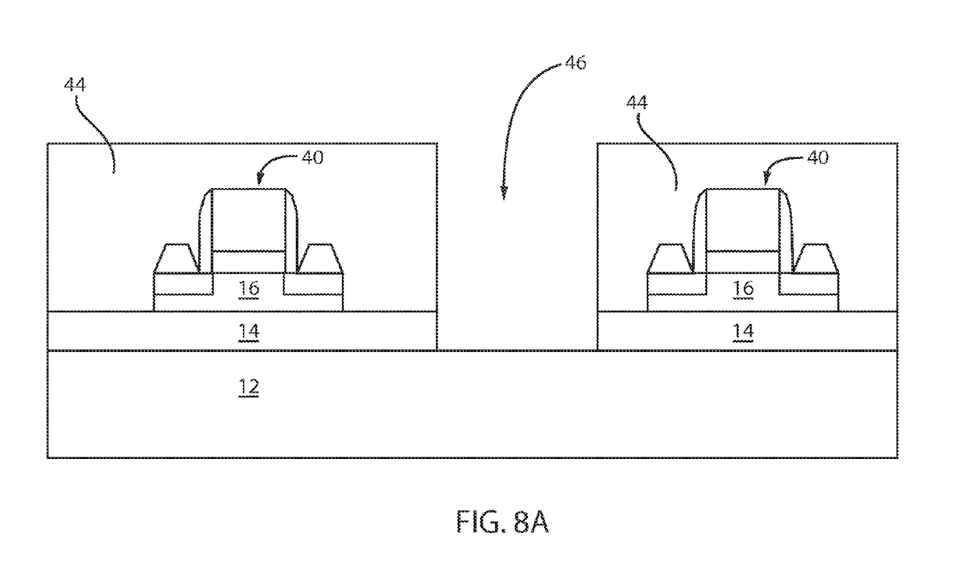
FIG. 8A is a cross-sectional view of the device of FIG. 7 showing the dummy plug removed to expose the semiconductor substrate in accordance with the present principles.

Referring to FIG. 8A, the dummy plug 24 is selectively etched from the substrate 12 (e.g., Si) and the dielectric material 44 (e.g., $SiO_2$). The selective etch may include a wet etch, such as, e.g., a hot phosphoric acid etch ($H_3PO_4$). The removal of the dummy plug 24 opens up a trench 46 in which the substrate 12 is exposed. In an alternate embodiment, the substrate 12 may be further etched at this point to form a deeper trench and/or a V-groove at the bottom of the trench 46. This will be described with reference to FIG. 8B.

Figure 8B:
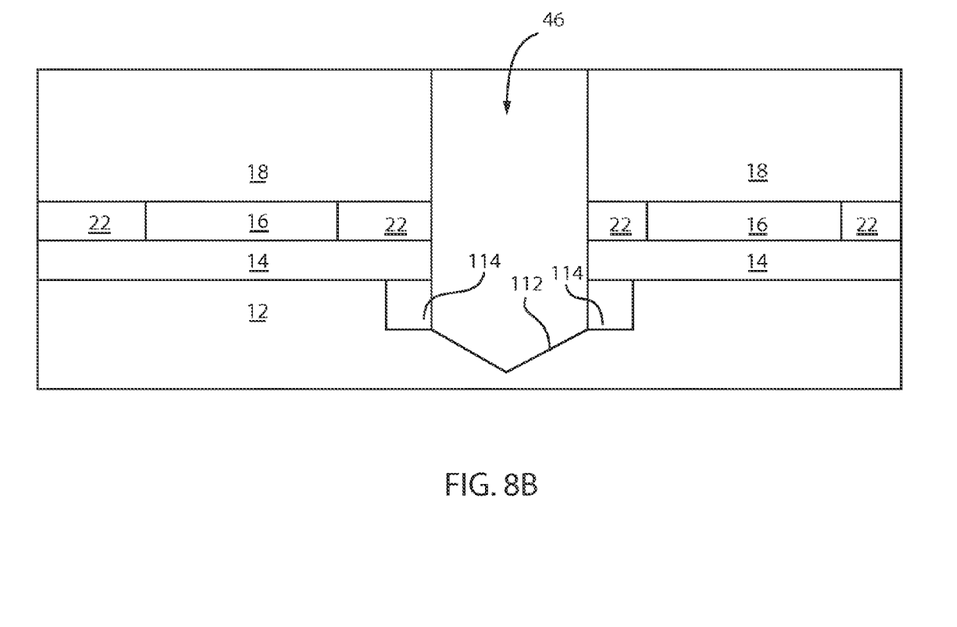
FIG. 8B is a cross-sectional view of a device of FIG. 8A showing the trench extended into a base semiconductor substrate in accordance with another embodiment.

Referring to FIG. 8B, in another embodiment, beginning with the structure in FIG. 8A (devices 40 are omitted in this the view), after the substrate 12 is exposed in trench 46, a dielectric layer 114 may be deposited and etched to form sidewall dielectric material 114. Then, a V-groove 112 may be formed as a result of wet etching the substrate 12 to expose crystal planes of Si in the substrate 12 to better assist in forming the III-V material 50 (later in the process). Processing from either FIGS. 8A and/or 8B continues with reference to FIG. 9.

Figure 9:
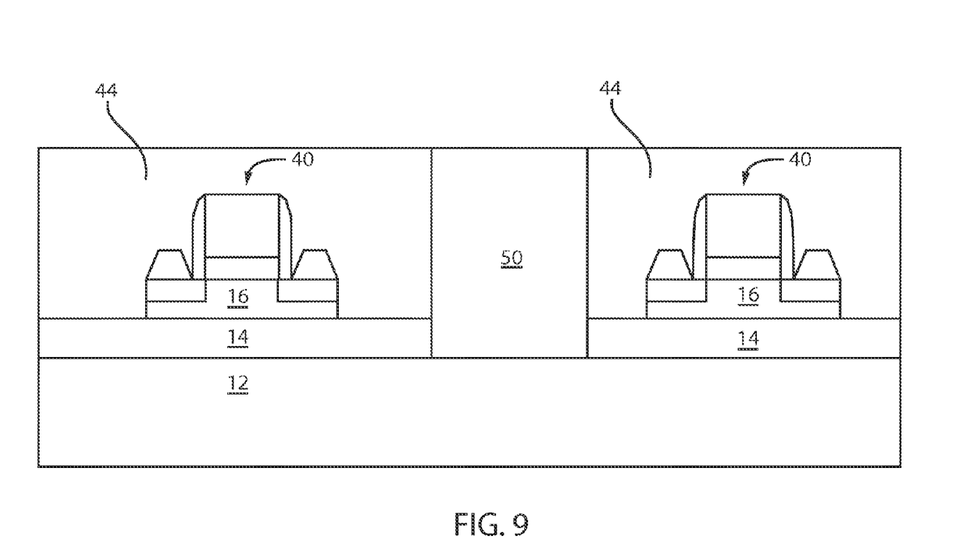
FIG. 9 is a cross-sectional view of the device of FIG. 8 showing a III-V material formed in the trench in accordance with the present principles.

Referring to FIG. 9, a III-V material 50 is grown from the substrate 12. III-V material 50 may include one or multiple layers of III-V semiconductor material, such as GaAs, GaN, InP, InGaAs, etc. The III-V material 50 is grown to become a base material or substrate for NMOS devices to be formed. The III-V material 50 is preferably grown using an epitaxial deposition process. Prior to growing the III-V material 50, a standard clean process may be performed on the substrate 12 to remove native oxide. In this case, the III-V epitaxy can be performed at a temperature of about 600 degrees C. or higher. In another embodiment, a higher temperature III-V epitaxy may be employed which desorbs native oxide. This process may employ a temperature of about 850 degrees C. or higher. Other processes and temperatures are also contemplated. After growth of the III-V material 50, a CMP process may be employed to planarize a top surface stopping on the dielectric material 44.

Figure 10:
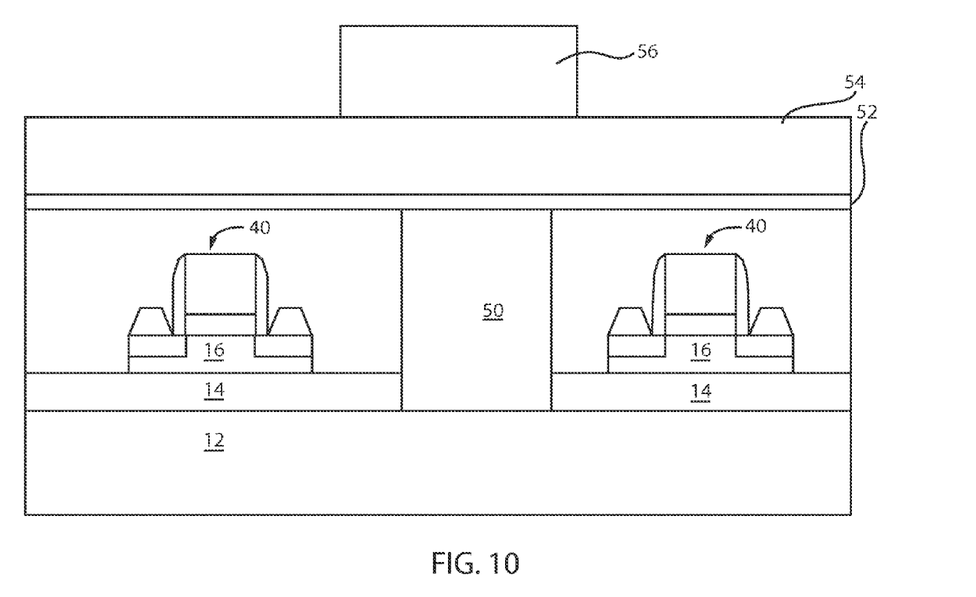
FIG. 10 is a cross-sectional view of the device of FIG. 9 showing a shield or polish stop layer and a dielectric layer having a resist mask formed thereon in accordance with the present principles.

Referring to FIG. 10, an interfacial dielectric layer 52 may be optionally deposited over the dielectric material 44 and the III-V material 50. The interfacial dielectric layer 52, if deposited, may include a thickness of between about 5 nm and 40 nm. The interfacial dielectric layer 52 may include a silicon nitride although other dielectric material may be employed. A dielectric layer 54 is deposited over the dielectric layer 52. The dielectric layer 54 may include silicon dioxide or other dielectric material suitable for forming a portion of an interlevel dielectric layer (e.g., dielectric glasses, organic dielectrics, etc.), as the interlevel dielectric is broken up into sections or levels in accordance with the present principles.

Next, an etch mask 56, e.g., a resist layer or other mask material is formed and patterned on the dielectric layer 54 in preparation for an etch process. The etch mask 56 is employed to designate an area for the formation of PMOS devices.

Figure 11:
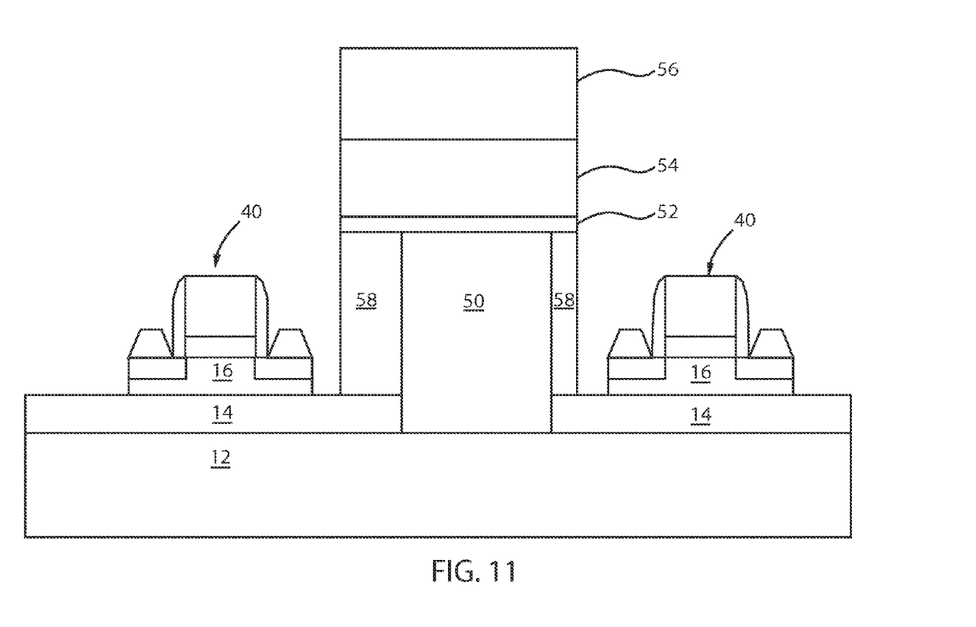
FIG. 11 is a cross-sectional view of the device of FIG. 10 showing the shield or polish stop layer and the dielectric layer after etching in accordance with the present principles.

Referring to FIG. 11, a reactive ion etch (RIE) process is employed to etch through the dielectric layer 54, the interfacial dielectric layer 52, if deposited, and the dielectric material 44. As a result of the etching process, dielectric sidewalls 58 or the dielectric material 44 remain formed on surfaces of the III-V material 50.

Figure 12:
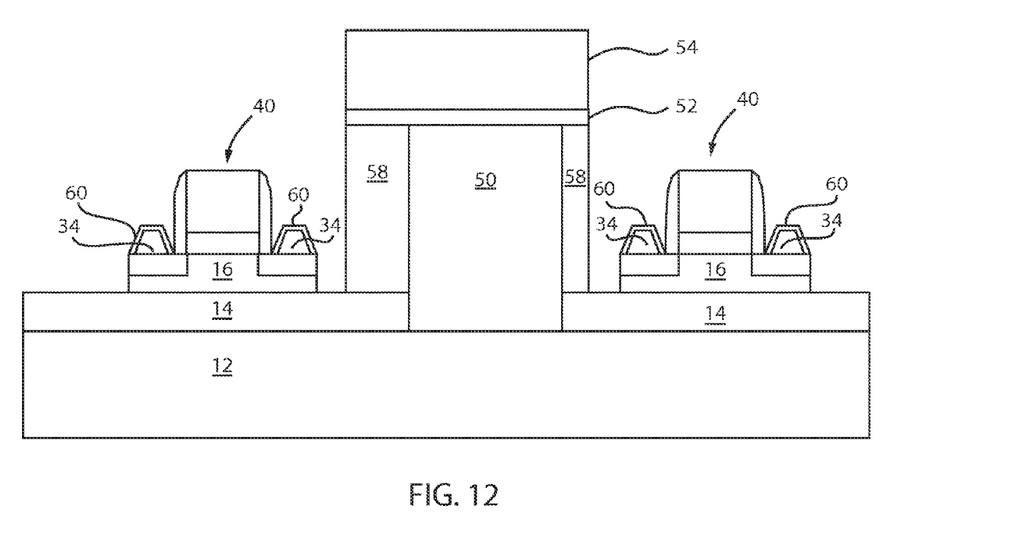
FIG. 12 is a cross-sectional view of the device of FIG. 11 showing the resist layer removed in accordance with the present principles.

Referring to FIG. 12, the etch mask 56 is removed (e.g., a resist strip). A siliciding process is performed to form silicided junctions 60 on the raised S/D regions 34. This may be performed by depositing a metal (e.g., Ni or Pt) over the raised S/D regions 34 and annealing to about 500 degrees C. The remaining metal is then removed, e.g., by wet etching. Other siliciding processes and temperatures may also be employed.

Figure 13:
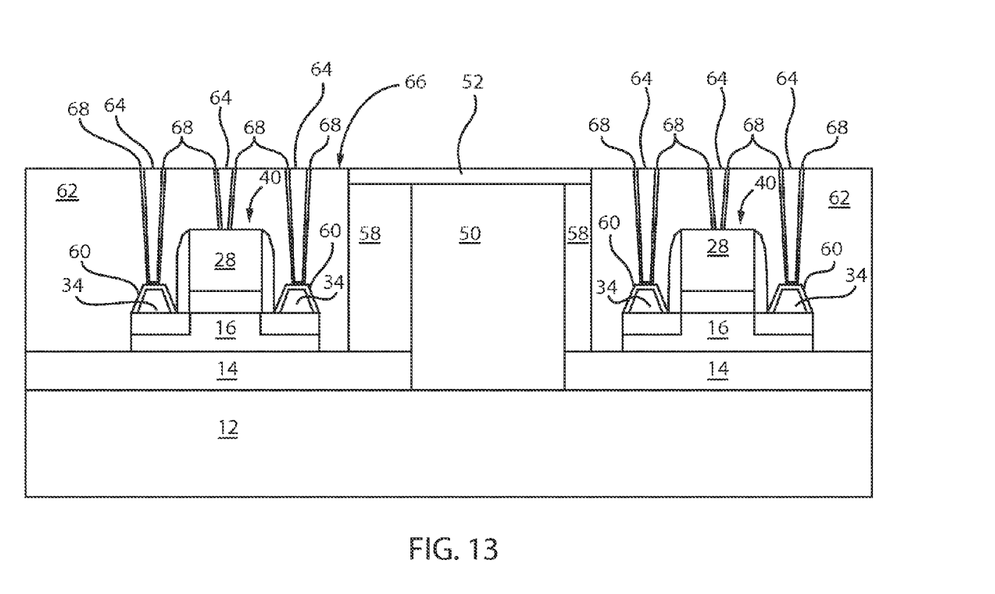
FIG. 13 is a cross-sectional view of the device of FIG. 12 showing a dielectric layer patterned to form via holes to a first level in accordance with the present principles.

Referring to FIG. 13, contact or via holes 64 are opened up in a dielectric layer 62. A deposition process is employed to form the dielectric layer 62 over the PMOS devices 40. The dielectric layer 62 may be deposited by a CVD process and planarized using a CMP process that stops of the interfacial dielectric layer 52. An etch mask (e.g., a resist) (not shown) is formed on the dielectric layer 62 and patterned. The pattern is employed to etch the via holes 64 down to the silicided junctions 60 and the gate conductors 28. Note that due to the distance between a top surface 66 and the silicided junctions 60/the gate conductors 28 a natural wedge shape or cone shape is formed for the via holes 64.

A diffusion barrier or liner 68 is formed in the via holes 64. The liner 68 includes a conformal deposition process followed by a CMP, which stops on the interfacial dielectric layer 52, which is employed as a polish or etch stop to several process steps. The liner 68 may include TiN or other suitable conductive material. The liner 68 will be employed to prevent inter-diffusion between the silicided junctions 60/the gate conductors 28 and the conductive material formed in the via holes 64 as contacts.

Figure 14:
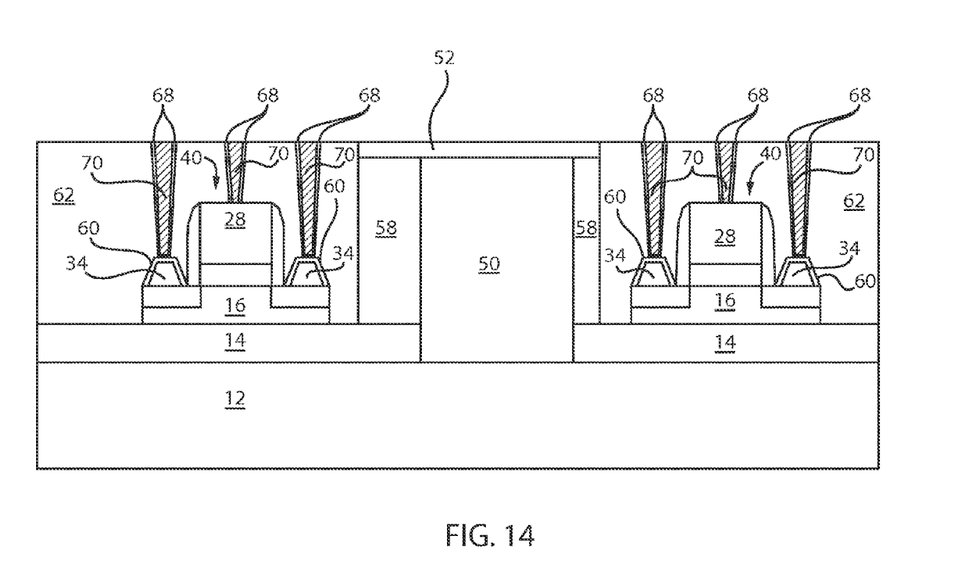
FIG. 14 is a cross-sectional view of the device of FIG. 13 showing contacts formed in the via holes and polished down to the polish stop layer in accordance with the present principles.

Referring to FIG. 14, a contact conductor 70 is formed in the via holes 64 on the liner 68. The conductor 70 includes a deposition process, such as CVD or plasma enhanced CVD (PECVD), etc. The deposition is followed by a CMP that stops on the interfacial dielectric layer 52, which is employed as a polish or etch stop. The conductor 70 may include Tungsten or other suitable conductive material. The liner 68 is employed to prevent inter-diffusion between the silicided junctions 60/the gate conductors 28 and the conductor 70 formed in the via holes 64 as contacts.

Figure 15:
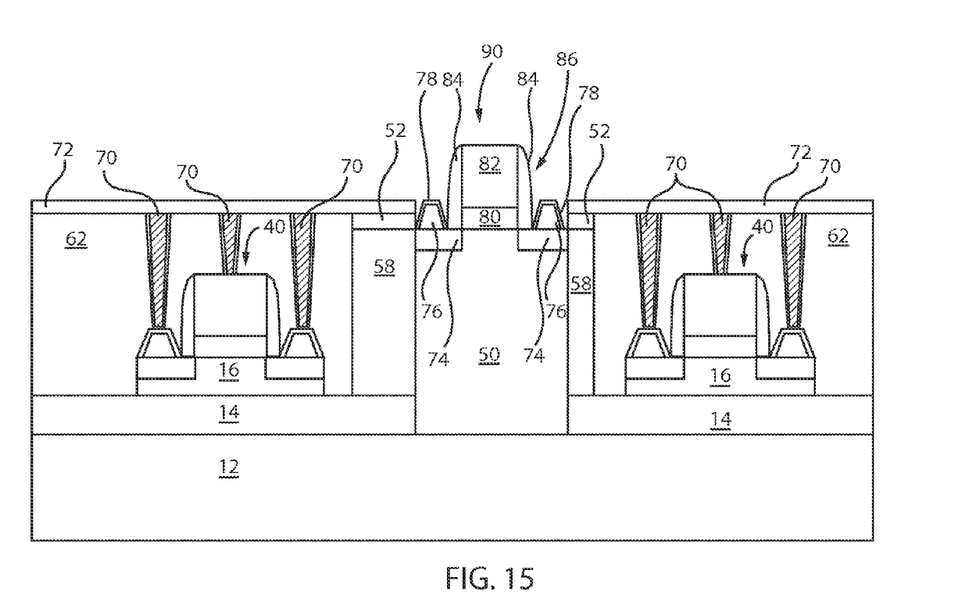
FIG. 15 is a cross-sectional view of the device of FIG. 14 showing a capping layer formed over the contacts, the capping layer and the polish stop layer being opened over the III-V material where second devices are formed in accordance with the present principles.

Referring to FIG. 15, the contacts 70 are capped with a dielectric capping layer 72. The capping layer 72 may include a thickness of between about 2 nm to about 200 nm, and more preferably between 5 nm and 20 nm. In one embodiment, the capping layer 72 includes SiN, although other materials may be employed. An etch mask (not shown) is formed over the capping layer 72, and portions of the capping layer 72 and the interfacial dielectric layer 52 are etched to expose the underlying III-V material 50 (NMOS open process).

Next, NMOS devices 90 are formed on the III-V material 50. A gate stack 86 is formed on the III-V material 50 by depositing and patterning a gate dielectric layer 80, which may include a high dielectric constant material (hi-K), such as, e.g., hafnium dioxide, etc. A gate conductor 82 is formed and patterned on and with the gate dielectric 80. The gate conductor 82 and the gate dielectric 80 may be patterned in a single mask etching process. The gate conductor 82 may include a metal, such as W, Ti, Cu, etc., or metal-containing compounds, e.g., TiN, TaN, etc. The gate dielectric 80 and gate conductor 82 formation processes may be performed at temperatures between about 400 and about 600 degrees C.

Sidewall spacers 84 are formed by depositing a dielectric material, e.g., silicon nitride, over the gate conductor 82 and the gate dielectric 80 and etching. The NMOS devices 90 include doped source and drain regions (S/D regions) 74 and raised S/D regions 76. The S/D regions 74 may be doped using an ion implantation process, a diffusion process, etc. to dope portions of the material 50. Raised S/D regions 76 may be formed by epitaxial growth in a formation processes that may be performed at temperatures of about 500 degrees C. The raised S/D regions 76 may be doped in-situ. Other processes and temperatures may also be employed.

A siliciding process is performed to form silicided junctions 78 on the raised S/D regions 76. The siliciding process may be performed at temperatures of about 400 degrees C. This may be performed by depositing a metal (e.g., Ni or Pt) over the raised S/D regions 76 and annealing to about 500 degrees C. The remaining metal is than removed, e.g., by wet etching. Other siliciding processes and temperatures may also be employed.

Figure 16:
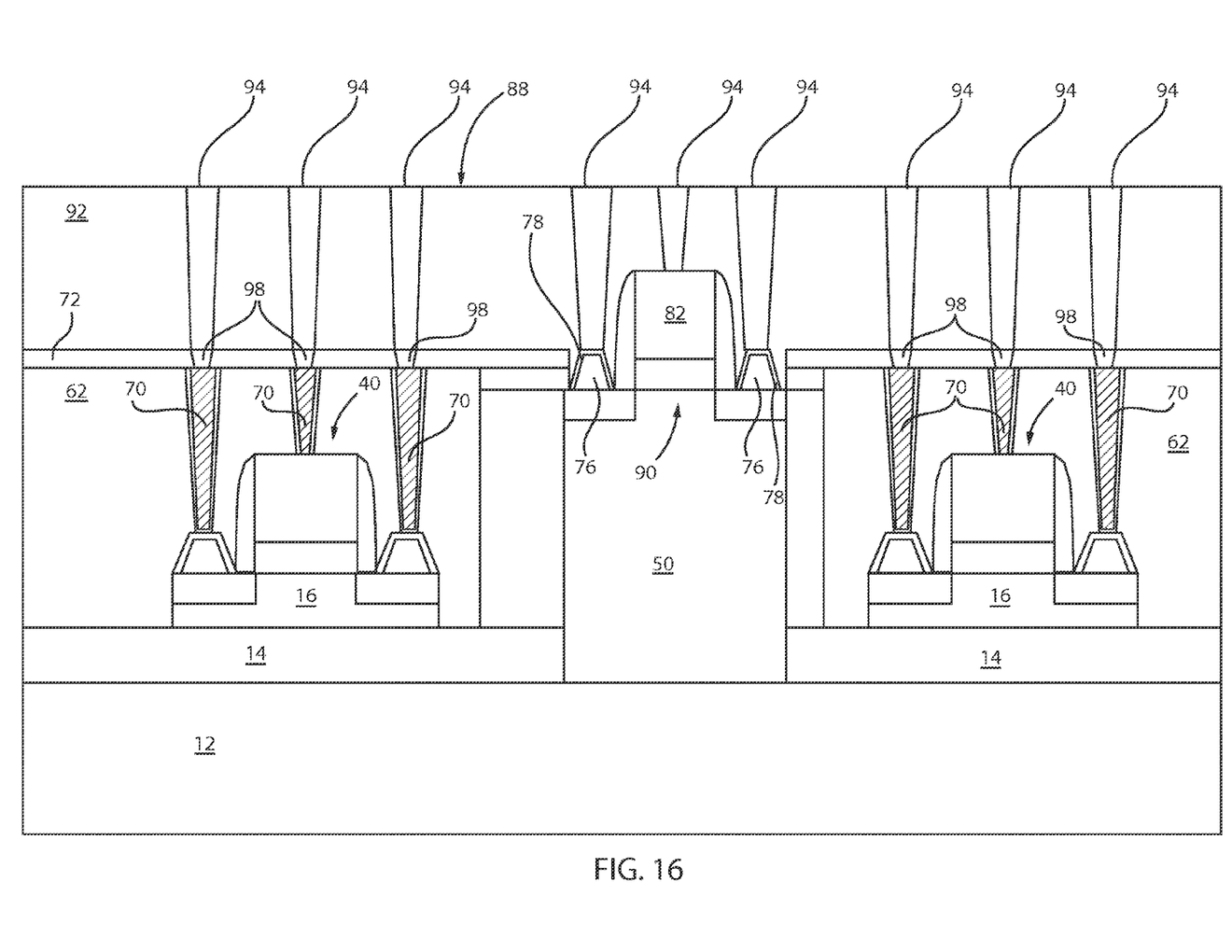
FIG. 16 is a cross-sectional view of the device of FIG. 15 showing a dielectric layer formed over the capping layer and via holes formed through the dielectric layer and into the capping layer in accordance with the present principles.

Referring to FIG. 16, a portion of an interlevel dielectric layer is formed by depositing a dielectric layer 92 over the capping layer 72 and the NMOS devices 90. Contact or via holes 94 are opened up in a dielectric layer 92. The interlevel dielectric layer includes layers 62 and 92 and capping layer 72. A deposition process is employed to form the dielectric layer 92 over the NMOS devices 90. The dielectric layer 92 may be deposited by a CVD process and planarized using a CMP process. An etch mask (e.g., a resist) (not shown) is formed on the dielectric layer 92 and patterned. The pattern is employed to etch the via holes 94 down to the silicided junctions 78 and the gate conductors 82. Note that due to the distance between a top surface 88 and the silicided junctions 78 and the top surface and the capping layer 72, a natural wedge shape or cone shape is formed in the via holes 94. It should be understood that by breaking up a complete contact connection to the PMOS devices 40 on a lower tier, the size of the via holes 94 and 64 (FIG. 13) are confined in width to preserve the overall occupied area of the via holes.

An open process is performed to open up holes 98 through the via holes 94 down to the contacts 70. This may be performed by generating a plasma and exposing the surface 88 and via holes 94 to the plasma. In one embodiment, the plasma may include $CF_4$ although other etchants or plasmas may be employed. One advantage to employing $CF_4$ is that III-V silicides 78 are resistant to etching by this material and survive well in its presence. The plasma etches through the capping layer 72 to expose the underlying contacts 70 through holes 98.

Figure 17:
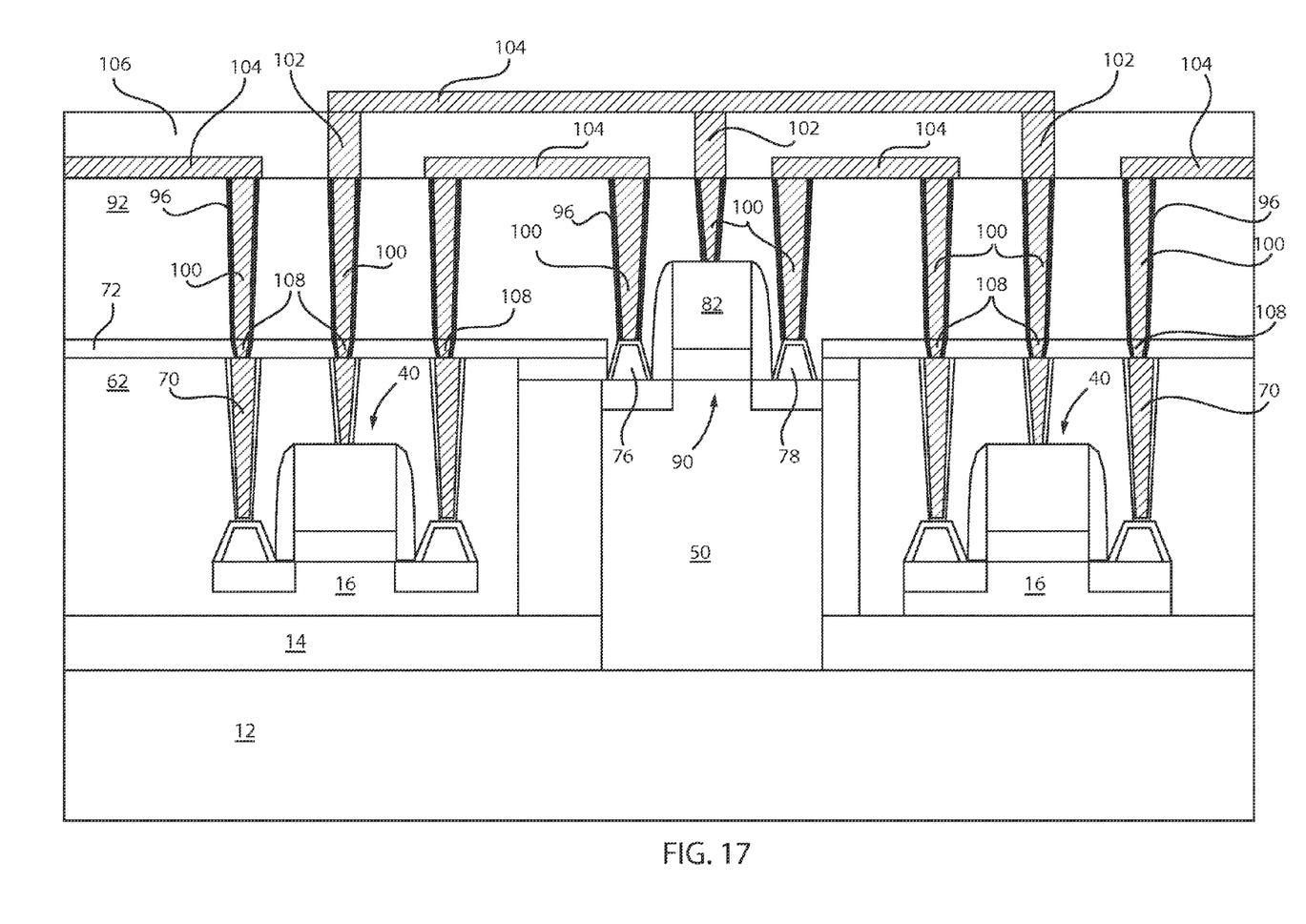
FIG. 17 is a cross-sectional view of the device of FIG. 16 showing second contacts and other metallization features formed in accordance with the present principles.

Referring to FIG. 17, a diffusion barrier or liner 96 is formed in the via holes 94 and holes 98. The liner 96 includes a conformal deposition process followed by a CMP to layer 92. The liner 96 may include TiN or other suitable conductive material. The liner 96 will be employed to prevent inter-diffusion between the silicided junctions 78/the gate conductors 82 and the conductive material formed in the via holes 94 as contacts 100. Holes 98 are also lined with liner 96.

Next, a contact conductor 100 is formed in the via holes 94 on the liner 96. The conductor 100 is formed in a deposition process, such as CVD or PECVD, followed by a CMP. The conductor 100 may include Tungsten or other suitable conductive material. The conductor is formed in the via holes 94 as contacts 100. The conductor 100 fills holes 98 to form a contact connector 108 that forms a multi-tiered contact structure. It is noted that the contact structure depicted in FIG. 17 shows two tiers of contacts (70 and 100); however, a greater number of tiers with multiple layers of contacts is also contemplated.

It should be noted that the contact connectors 108 are not conventional metal lines, but include pin holes, elongated lines, etc. configured for the purpose of connecting two contact layers in a multi-tiered structure. In one embodiment, the multi-tiered structure is configured to span a single contact level and, although the multi-tiered structure can be employed in other ways, the multi-tiered structure replaces a signal level contact with multiple contact portions, e.g., 70, 100, connected by a contact connector 108. The size of connector 108 may be similar to the tip of via holes 64 (FIG. 13), e.g., a tip of via hole 64 at the junction where via 64 contacts the PMOS silicide 60.

Processing continues with the formation of additional tiers or the formation of additional dielectric layers 106 and metal layers 104 connected by contacts 102. Such metal layers may be M1, M2, etc. or other back-end-of line structures. It should also be understood that while NMOS/PMOS devices are described on different levels, the present principles are not limited to these structures and are instead applicable to any device structures where a long depth needs to be covered in a low dimension node technology. The multi-tiered structure may include heights of, e.g., 20 nm to about 300 nm, for silicon CMOS technology, where presently a single via contact for M1 is sized about 10 nm-50 nm×10 nm-50 nm, and the depth of a single via contact for M1 is about 50 nm-100 nm. A step height difference between NMOS and PMOS can be about 40 nm-300 nm. Since the via has wedge shape, the available depth of the via is constrained by its size, limited by the pitch size of CMOS devices, in the silicon CMOS process. In accordance with the present principles, this constraint can be relieved and much deeper vias can be achieved with the same via size.

It should be further understood that while the III-V NMOS described herein is achieved by hetero-epitaxy on a silicon (or other material) substrate. Other process integration schemes for forming III-V material on Si (or other material) may be employed. For example, wafer bonding may be applied to provide the III-V or other material, and the multi-tiered contact structure may be employed to handle height differences. The multi-tiered contact structure may be employed in any device as long as there is a height difference between landings for contacts. The present principles are not limited to the described structures and are instead applicable to any device structures where a depth needs to be covered in a low dimension node technology. For example, the present principles may be applied to a III-V substrate with a silicon substrate formed thereon by hetero-epitaxy or wafer bonding to provide the greater height portion, etc.

It should also be noted that, in some alternative implementations, the functions described may occur out of the order noted in the figures. For example, two figures shown in succession may, in fact, be executed substantially concurrently, or the steps may sometimes be executed in the reverse order, depending upon the functionality involved.

Having described preferred embodiments of a multiple via structure and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a device with a multi-tiered contact structure, the method comprising:
   forming first contacts in first via holes down to a first level;
   forming a dielectric capping layer over exposed portions of the first contacts;
   forming a dielectric layer over the dielectric capping layer;
   opening second via holes in the dielectric layer down to the dielectric capping layer;
   opening connecting holes in the dielectric capping layer through the second via holes to expose the first contacts;
   forming a diffusion liner on sidewalls of the second via holes and the connecting holes, the diffusion liner leaving the first contacts in the first via holes exposed;
   forming contact connectors in the connecting holes formed in the dielectric capping layer, the contact connectors directly contacting the exposed first contacts; and
   forming second contacts in the second via holes directly over the contact connectors, the second contacts connected to the first contacts through the dielectric capping layer by the contact connectors to form multi-tiered contacts.

2. The method as recited in claim 1, wherein the first contacts reach a depth of the first level and a portion of the second contacts land on a second level, which is vertically offset from the first level.

3. The method as recited in claim 2, wherein a vertical offset between the first level and the second level is greater than 40 nm.

4. The method as recited in claim 2, wherein the first level includes first complementary metal oxide semiconductor devices (CMOS) and the second level includes second CMOS devices having an opposite conductivity from the first CMOS devices.

5. The method as recited in claim 1, wherein opening connecting holes in the dielectric capping layer includes:
   employing the dielectric layer as a mask; and
   subjecting the dielectric capping layer to a plasma etch to expose the first contacts underlying the dielectric capping layer.

6. The method as recited in claim 1, wherein the multi-tiered contact structure has includes a depth of greater than 40 nm for a node of 22 nm or less.

7. The method as recited in claim 1, wherein the dielectric capping layer includes a thickness of 5 nm to 20 nm.

8. The method as recited in claim 1, wherein the connecting holes include at least one of: pin holes or elongated lines.

9. A method for forming a device with a multi-tiered contact structure, the method comprising:
   forming first devices on a first semiconductor substrate material at a first level;
   forming second devices at a second level, which is vertically offset from the first level, on a second semiconductor substrate formed over the first semiconductor substrate;
   depositing a first dielectric layer over the first devices;
   forming first contacts in first via holes through the first dielectric layer down to the first level;
   forming a dielectric capping layer over exposed portions of the first contacts;
   forming second devices at a second level, which is vertically offset from the first level, on a second semiconductor material formed over the first semiconductor material;
   forming a second dielectric layer over the dielectric capping layer and the second devices;
   opening second via holes in the second dielectric layer down to the dielectric capping layer;
   opening connecting holes in the dielectric capping layer through the second via holes to expose the first contacts;
   forming contact connectors in the dielectric capping layer, the contact connectors formed in the connecting holes of the dielectric capping layer to directly contact the exposed first contacts; and
   forming second contacts in the second dielectric layer directly over the contact connectors formed in the dielectric capping layer, the second contacts formed in the second via holes of the second dielectric layer, wherein the second contacts connected to the first contacts through the dielectric capping layer by the contact connectors to form multi-tiered contacts.

10. The method as recited in claim 9, wherein the first contacts land on the first devices on the first level and a portion of the second contacts land on the second devices on the second level.

11. The method as recited in claim 9, wherein a vertical offset between the first level and the second level is greater than 40 nm.

12. The method as recited in claim 9, wherein the first devices include first complementary metal oxide semiconductor devices (CMOS) and the second devices include second CMOS devices having an opposite conductivity from the first CMOS devices.

13. The method as recited in claim 9, wherein opening holes in the dielectric capping layer includes:
   employing the second dielectric layer as a mask; and
   subjecting the dielectric capping layer to a plasma etch to expose the first contacts underlying the dielectric capping layer.

14. The method as recited in claim 9, wherein the multi-tiered contact structure includes a depth of greater than 40 nm for a node of 22 nm or less.

15. The method as recited in claim 9, wherein the first semiconductor material includes silicon, and the second semiconductor material includes a 111-V material.

16. The method as recited in claim 9, wherein forming first contacts in first via holes through the first dielectric layer down to the first level includes:
   depositing a portion of a thickness of an interlevel dielectric layer;
   patterning the portion of the thickness of the interlevel dielectric layer to form the first via holes;
   depositing a conductor material in the first via holes; and
   planarizing the conductor material and stopping on a polish stop layer formed over the second semiconductor material.

17. The method as recited in claim 9, wherein the connecting holes include at least one of: pin holes or elongated lines.

\* \* \* \* \*